(12) United States Patent
Hayashi

(10) Patent No.: US 11,276,586 B2
(45) Date of Patent: Mar. 15, 2022

(54) SEMICONDUCTOR MANUFACTURING APPARATUS AND METHOD FOR MANUFACTURING SEMICONDUCTOR DEVICE

(71) Applicant: Kioxia Corporation, Tokyo (JP)

(72) Inventor: Hidekazu Hayashi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/275,118

(22) Filed: Feb. 13, 2019

(65) Prior Publication Data
US 2020/0083066 A1    Mar. 12, 2020

(30) Foreign Application Priority Data
Sep. 10, 2018    (JP) .............................. JP2018-169035

(51) Int. Cl.
*H01L 21/67* (2006.01)
*H01L 21/306* (2006.01)

(52) U.S. Cl.
CPC .. *H01L 21/67075* (2013.01); *H01L 21/30604* (2013.01)

(58) Field of Classification Search
None
See application file for complete search history.

(56) References Cited

U.S. PATENT DOCUMENTS

| 5,632,873 A * | 5/1997 | Stevens | C23C 14/50 |
| | | | 118/503 |
| 5,942,041 A * | 8/1999 | Lo | H01L 21/68721 |
| | | | 118/728 |
| 6,793,769 B2 * | 9/2004 | Kajino | C03C 15/00 |
| | | | 134/33 |
| 6,935,638 B2 * | 8/2005 | Ivanov | B23B 31/14 |
| | | | 118/416 |
| 7,998,308 B2 * | 8/2011 | Kaneko | H01L 21/67051 |
| | | | 134/119 |

(Continued)

FOREIGN PATENT DOCUMENTS

JP    2003-151939 A    5/2003
JP    2006-339330 A    12/2006
(Continued)

OTHER PUBLICATIONS

Machine Generated English Translation of the description of JP2003151939A. Published May 23, 2003 (Year: 2003).*
(Continued)

*Primary Examiner* — Sylvia MacArthur
(74) *Attorney, Agent, or Firm* — Foley & Lardner LLP (57) ABSTRACT

A semiconductor manufacturing apparatus includes a mounting unit arranged to mount an annular member, having an annular shape, to a work substrate including a first substrate and a second substrate bonded to each other so that the annular member surrounds the first substrate. The apparatus further includes a holding unit arranged to hold the work substrate having the annular member mounted thereto. The apparatus further includes a first fluid supply unit arranged to supply a first fluid to the second substrate of the work substrate held by the holding unit.

13 Claims, 7 Drawing Sheets

(56) References Cited

U.S. PATENT DOCUMENTS

| | | | |
|---|---|---|---|
| 8,043,467 B2* | 10/2011 | Nanba | H01L 21/31055 118/320 |
| 8,313,609 B2* | 11/2012 | Yoshida | H01L 21/67051 156/345.18 |
| 8,366,872 B2* | 2/2013 | Tsutsumi | C23C 26/00 156/345.51 |
| 8,398,817 B2* | 3/2013 | Namba | H01L 21/0209 156/345.21 |
| 8,741,099 B2* | 6/2014 | Higashijima | H01L 21/6708 156/345.55 |
| 9,784,573 B2* | 10/2017 | Sato | G01B 11/272 |
| 2008/0069951 A1* | 3/2008 | Chacin | C23C 16/45521 427/248.1 |
| 2009/0111245 A1 | 4/2009 | Okabe et al. | |
| 2009/0200251 A1* | 8/2009 | Shimizu | C23C 16/45544 211/41.18 |
| 2010/0200547 A1* | 8/2010 | Higashijima | H01L 21/6708 216/92 |
| 2013/0118530 A1 | 5/2013 | Komeda et al. | |
| 2013/0213437 A1* | 8/2013 | Ishii | H01L 21/68728 134/6 |
| 2014/0261554 A1 | 9/2014 | Hayashi et al. | |
| 2015/0122775 A1* | 5/2015 | Sankarakrishnan | H01J 37/32477 216/67 |
| 2017/0084470 A1* | 3/2017 | Suzuki | B08B 3/10 |
| 2017/0182515 A1* | 6/2017 | Emoto | H01L 21/67028 |
| 2018/0337067 A1* | 11/2018 | Kosai | H01L 21/02057 |
| 2020/0083066 A1* | 3/2020 | Hayashi | H01L 21/30604 |

FOREIGN PATENT DOCUMENTS

| | | |
|---|---|---|
| JP | 2011-071283 A | 4/2011 |
| WO | WO 2014/199845 A1 | 12/2014 |
| WO | WO 2017/018219 A1 | 2/2017 |

OTHER PUBLICATIONS

Machine Generated English Translation of the claims of JP2003151939A. Published May 23, 2003 (Year: 2003).*

* cited by examiner

SEMICONDUCTOR MANUFACTURING APPARATUS AND METHOD FOR MANUFACTURING SEMICONDUCTOR DEVICE

CROSS-REFERENCE TO RELATED APPLICATION

This application is based upon and claims the benefit of priority from. Japanese Patent Application No. 2018-169035, filed Sep. 10, 2018, the entire contents of which are incorporated herein by reference.

FIELD

Embodiments described herein relate generally to a semiconductor manufacturing apparatus and a method for manufacturing a semiconductor device.

BACKGROUND

When wafers are bonded together and a predetermined portion (for example, a silicon wafer portion) of one of the wafers is removed by, for example, etching, it is often undesirable that a portion of the other wafer is removed.

DETAILED DESCRIPTION

Embodiments provide a semiconductor manufacturing apparatus capable of appropriately removing a part of substrates bonded together and a method for manufacturing a semiconductor device.

In general, according to at least one embodiment, a semiconductor manufacturing apparatus includes a mounting unit that mounts an annular member having an annular shape to a work substrate including a first substrate and a second substrate bonded to each other in such a way as to surround the first substrate. The apparatus further includes a holding unit that holds the work substrate having the annular member mounted thereto. The apparatus further includes a first fluid supply unit that supplies a first fluid to the second substrate of the work substrate held by the holding unit.

Hereinafter, embodiments of the present disclosure will be described with reference to the drawings. In FIG. 1 to FIGS. 7A and 7B, the same or similar constituent elements are assigned the respective same reference characters, and any duplicated description thereof is not repeated.

First Embodiment

Figure 1:
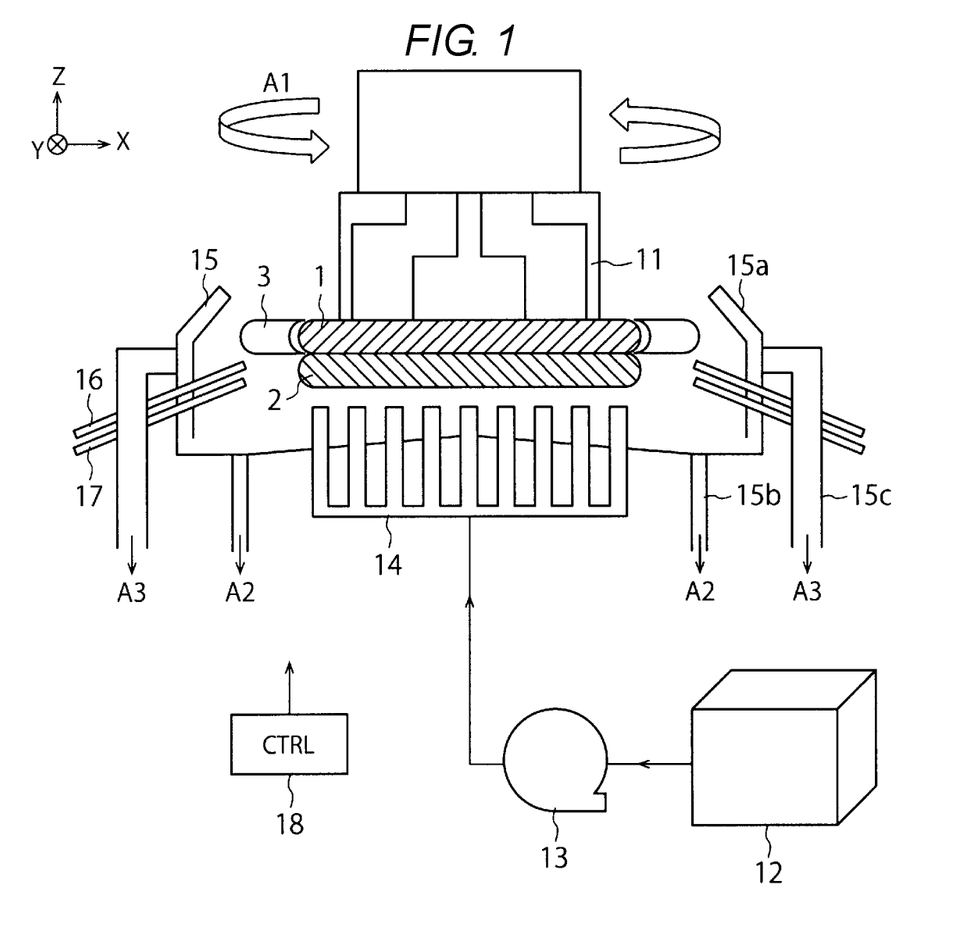
FIG. 1 is a sectional view schematically illustrating a structure of a semiconductor manufacturing apparatus according to a first embodiment.

FIG. 1 is a sectional view schematically illustrating a structure of a semiconductor manufacturing apparatus according to a first embodiment.

The semiconductor manufacturing apparatus according to at least one embodiment is an etching apparatus which processes a work wafer by wet etching. FIG. 1 illustrates a work wafer including a first wafer 1 and a second wafer 2 bonded to each other. The first wafer 1 is an example of a first substrate, the second wafer 2 is an example of a second substrate, and the work wafer is an example of a work substrate.

Referring to FIG. 1, a protection ring 3 having an annular shape (ring shape) is mounted to the work wafer in such a way as to surround the first wafer 1. The protection ring 3 is mounted to the work wafer so as to prevent or reduce etching of the first wafer 1 when etching is performed on the second wafer 2. The protection ring 3 is an example of an annular member.

FIG. 1 illustrates an X-direction and a Y-direction, which are parallel to the surfaces of the first wafer 1 and the second wafer 2 and are perpendicular to each other, and a Z-direction which is perpendicular to the surfaces of the first wafer 1 and the second wafer 2. In the present specification, the plus Z-direction is treated as an upward direction, and the minus Z-direction is treated as a downward direction. The minus Z-direction may coincide with the direction of gravitational force or does not need to coincide with the direction of gravitational force.

The semiconductor manufacturing apparatus illustrated in FIG. 1 includes a vacuum chuck 11, which is an example of a holding unit, an etching liquid tank 12, an etching liquid pump 13, a multiple nozzle array 14, which is an example of a first fluid supply unit, a wafer containing unit 15, a protective liquid nozzle 16, which is an example of a second fluid supply unit, a gas nozzle 17, and a control unit 18. The wafer containing unit 15 includes a surrounding wall 15a, a drain portion 15b, and an exhaust portion 15c.

The vacuum chuck 11 holds and rotates the work wafer. The vacuum chuck 11 in at least one embodiment holds the work wafer in such a manner that the first wafer 1 is situated on the upper side and the second wafer 2 is situated on the lower side. Moreover, the vacuum chuck 11 holds the work wafer in such a manner that the vacuum chuck 11 is in contact with only the first wafer 1 among the first wafer 1 and the second wafer 2 so as not to hinder etching of the second wafer 2. Specifically, the vacuum chuck 11 is in contact with the upper surface of the first wafer 1 to hold the work wafer. As indicated by an arrow A1, the vacuum chuck 11 rotates the work wafer around the central axis of the first wafer 1 or the second wafer 2.

The semiconductor manufacturing apparatus according to at least one embodiment includes, as described below, a ring attaching and detaching unit which attaches the protection ring 3 to the work wafer and detaches the protection ring 3 from the work wafer. In at least one embodiment, the work wafer having the protection ring 3 mounted thereto is conveyed to the vacuum chuck 11 from the ring attaching and detaching unit and is then held by the vacuum chuck 11 as illustrated in FIG. 1.

The etching liquid tank 12 stores an etching liquid used to perform etching of the second wafer 2. The etching liquid is an example of a first fluid. The etching liquid pump 13 transfers the etching liquid stored in the etching liquid tank 12 to the multiple nozzle array 14. The multiple nozzle array 14 supplies the etching liquid to the second wafer 2 of the work wafer held by the vacuum chuck 11. As a result, at least a part of the second wafer 2 is removed with the etching liquid, so that, for example, a silicon wafer portion in the second wafer 2 is removed. In at least one embodiment, the etching liquid is ejected onto the lower surface of the second wafer 2, so that etching is performed on the second wafer 2 starting with the lower surface thereof.

The wafer containing unit 15 contains the work wafer held by the vacuum chuck 11. The etching liquid in at least one embodiment is ejected onto the work wafer, which is being rotated by the vacuum chuck 11, and, therefore, scatters laterally due to centrifugal force from the work wafer and then collides with the surrounding wall 15a. The etching liquid colliding with the surrounding wall 15a drops down and is discharged from the drain portion 15b to the outside as indicated by an arrow A2. Other liquids used in the semiconductor manufacturing apparatus according to at least one embodiment are also discharged from the drain portion 15b to the outside. On the other hand, gas used in the semiconductor manufacturing apparatus according to the present embodiment is discharged from the exhaust portion 15c to the outside as indicated by an arrow A3.

The protective liquid nozzle 16 ejects a protective liquid, which is used to prevent or reduce etching of the first wafer 1 with the above-mentioned etching liquid, to a boundary between the first wafer 1 and the second wafer 2. This enables protecting a portion which is intended not to be etched in the work wafer with the protection ring 3 and the protective liquid. The protective liquid is an example of a second fluid. The protective liquid is, for example, pure water, and, in this case, this pure water may also be used to rinse the boundary between the first wafer 1 and the second wafer 2.

The gas nozzle 17 ejects gas to the boundary between the first wafer 1 and the second wafer 2. This gas is used to, for example, cool or dry the boundary. An example of this gas is nitrogen gas.

The control unit 18 controls various operations of the semiconductor manufacturing apparatus. Examples of the control unit 18 include a processor, an electrical circuit, and a personal computer (PC). For example, the control unit 18 controls rotation of the vacuum chuck 11, operation of the etching liquid pump 13, and ejection operations of the multiple nozzle array 14, the protective liquid nozzle 16, and the gas nozzle 17.

Figure 2:
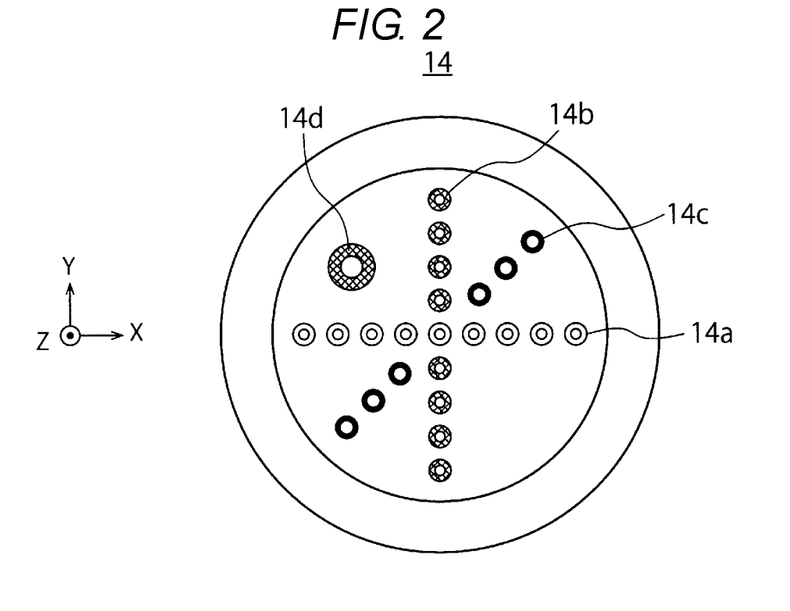
FIG. 2 is a top view illustrating a structure of a multiple nozzle array in the first embodiment.

FIG. 2 is a top view illustrating a structure of the multiple nozzle array 14 in the first embodiment.

As illustrated in FIG. 2, the multiple nozzle array 14 includes a plurality of etching liquid nozzles 14a, a plurality of rinse liquid nozzles 14b, a plurality of gas nozzles 14c, and a thickness monitor 14d, which is an example of a detection unit.

The etching liquid nozzle 14a ejects the above-mentioned etching liquid onto the lower surface of the second wafer 2, thus performing etching on the second wafer 2 with the etching liquid. Examples of the etching liquid include a hydrofluoric acid aqueous solution, a nitric acid aqueous solution, and an alkaline aqueous solution. In at least one embodiment, ejecting the etching liquid from the etching liquid nozzles 14a, which are arranged in a line, onto the work wafer, which is rotating, enables supplying the etching liquid to the entire lower surface of the second wafer 2.

The rinse liquid nozzle 14b ejects the rinse liquid onto the lower surface of the second wafer 2, thus rinsing the second wafer 2 with the rinse liquid. The rinse liquid is, for example, pure water. In at least one embodiment, ejecting the rinse liquid from the rinse liquid nozzles 14b, which are arranged in a line, onto the work wafer, which is rotating, enables supplying the rinse liquid to the entire lower surface of the second wafer 2.

The gas nozzle 14c ejects gas onto the lower surface of the second wafer 2. This gas is used to, for example, cool or dry the lower surface of the second wafer 2. An example of this gas is nitrogen gas. In at least one embodiment, ejecting gas from the gas nozzles 14c, which are arranged in a line, onto the work wafer, which is rotating, enables supplying gas to the entire lower surface of the second wafer 2.

The thickness monitor 14d detects the thickness of a silicon wafer in the second wafer 2, and outputs a result of detection of the thickness to the control unit 18. The control unit 18 causes the etching liquid nozzles 14a to eject the etching liquid onto the silicon wafer based on the thickness detected by the thickness monitor 14d. This enables, for example, performing etching until the silicon wafer is completely removed or thinning the silicon wafer to a predetermined thickness.

Figure 3A:
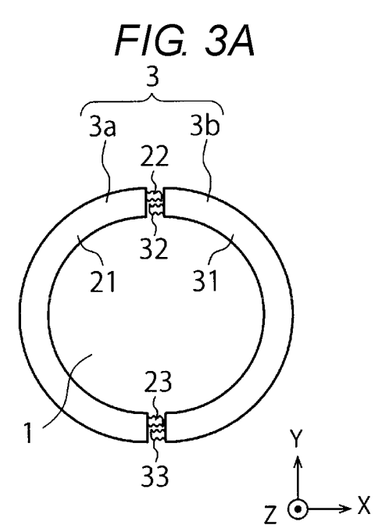
FIGS. 3A, 3B, and 3C are top views and a sectional view illustrating a structure of a protection ring in the first embodiment.
Figure 3B:
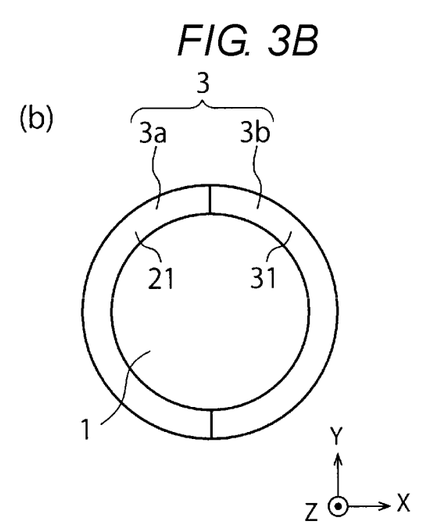
Figure 3C:
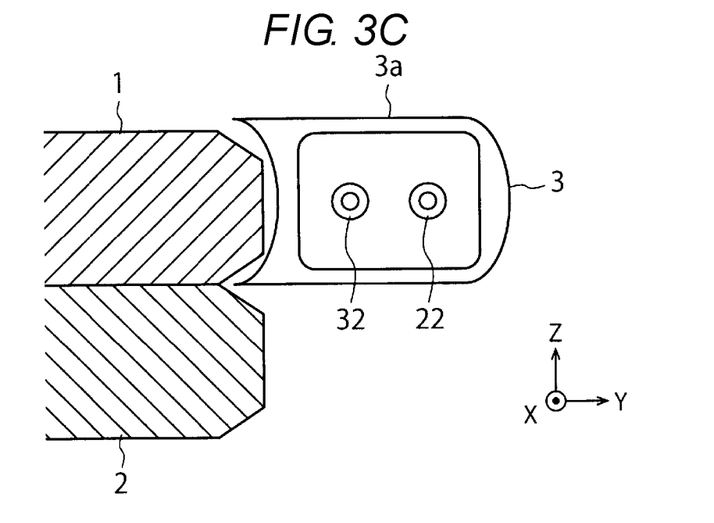

FIGS. 3A, 3B, and 3C are top views and a sectional view illustrating a structure of the protection ring 3 in the first embodiment. FIGS. 3A and 3B each represent a top view and FIG. 3C represents a sectional view.

As illustrated in FIG. 3A, the protection ring 3 includes a first section 3a, which includes a circular arc portion 21, a raised portion 22 provided at one end of the circular arc portion 21, and a raised portion 23 provided at the other end of the circular arc portion 21, and a second section 3b, which includes a circular arc portion 31, a raised portion 32 provided at one end of the circular arc portion 31, and a raised portion 33 provided at the other end of the circular arc portion 31.

The first section 3a includes the raised portions 22 and 23 at both ends of the circular arc portion 21 and also includes recessed portions, into which to insert the raised portions 32 and 33 of the second section 3b, at both ends of the circular arc portion 21. Similarly, the second section 3b includes the raised portions 32 and 33 at both ends of the circular arc portion 31 and also includes recessed portions, into which to insert the raised portions 22 and 23 of the first section 3a, at both ends of the circular arc portion 31. Therefore, inserting these raised portions 22, 23, 32, and 33 into these recessed portions enables mounting the protection ring 3 around the first wafer 1 of the work wafer, as illustrated in FIG. 3B. On the other hand, extracting these raised portions 22, 23, 32, and 33 from these recessed portions enables detaching the protection ring 3 from around the first wafer 1 of the work wafer.

FIG. 3C illustrates a cross-section of the protection ring 3, and, specifically, illustrates one end of the circular arc portion 21 of the first section 3a, the raised portion 22 provided at one end of the circular arc portion 21, and the raised portion 32 inserted into the recessed portion at one end of the circular arc portion 21. FIG. 3C further illustrates a seal member provided at one end of the circular arc portion 21 in such a way as to surround these raised portions 22 and 33 and recessed portion. The protection ring 3 in at least one embodiment includes such a seal member at both ends of the circular arc portion 21 and both ends of the circular arc portion 31. This enables sealing a clearance between the first section 3a and the second section 3b, and enables preventing or reducing the etching liquid from penetrating from the clearance into the work wafer.

Furthermore, in at least one embodiment, instead of including the above-mentioned raised portions and recessed portions, the first section 3a and the second section 3b may be interconnected by a plurality of springs. For example, one end of the circular arc portion 21 and one end of the circular arc portion 31 may be interconnected by a spring and the other end of the circular arc portion 21 and the other end of the circular arc portion 31 may be interconnected by a spring. In this case, expanding or contracting the springs enables mounting the protection ring 3 to the work wafer or detaching the protection ring 3 from the work wafer.

Figure 4:
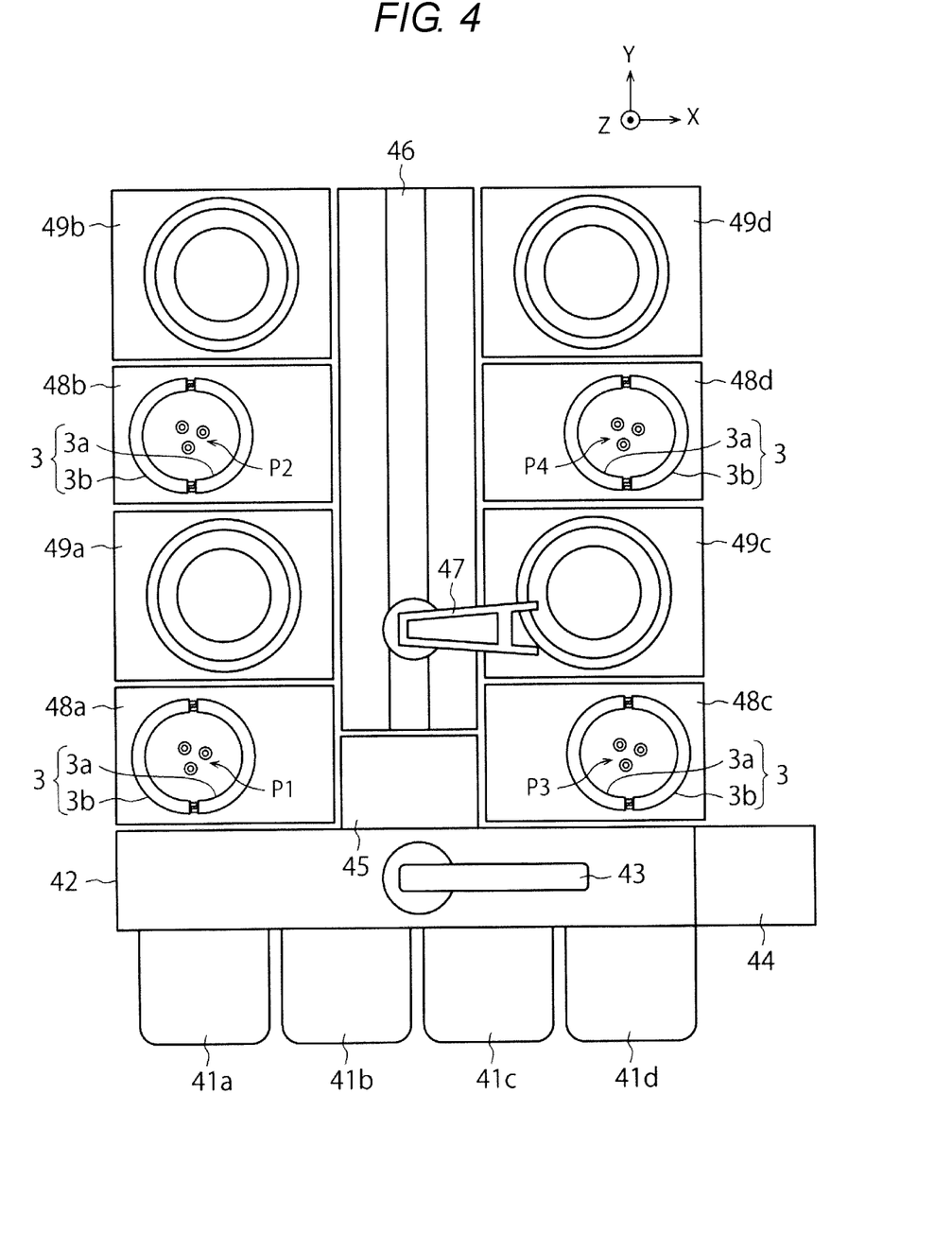
FIG. 4 is a top view schematically illustrating the structure of the semiconductor manufacturing apparatus according to the first embodiment.

FIG. 4 is a top view schematically illustrating the structure of the semiconductor manufacturing apparatus according to the first embodiment.

The semiconductor manufacturing apparatus according to at least one embodiment includes, in addition to the constituent elements illustrated in FIG. 1, load units 41a to 41d, an interface unit 42, a first arm 43, a reversing unit 44, a buffer unit 45, a conveyance rail 46, a second arm 47, ring attaching and detaching units 48a to 48d, each of which is an example of amounting unit, and wet processing units 49a to 49d.

Each of the load units 41a to 41d is a table on which to place a work wafer which is carried in the semiconductor manufacturing apparatus or a work wafer which is carried out of the semiconductor manufacturing apparatus. Four work wafers are able to be placed on the load units 41a to 41d. A work wafer which is carried in the semiconductor manufacturing apparatus is placed on any one of the load units 41a to 41d in such a state that the first wafer 1 is situated on the lower side and the second wafer 2 is situated on the upper side.

The interface unit 42 is equivalent to a doorway for a work wafer into or out of the semiconductor manufacturing apparatus. The work wafer placed on any one of the load units 41a to 41d is carried in the interface unit 42 by the first arm 43 and is then transferred to the reversing unit 44.

The reversing unit 44 receives the work wafer, which is in a state in which the first wafer 1 is situated on the lower side and the second wafer 2 is situated on the upper side, and then reverses the orientation of the work wafer in such a manner that the first wafer 1 is situated on the upper side and the second wafer 2 is situated on the lower side. The work wafer with the orientation thereof reversed is transferred by the first arm 43 from the reversing unit 44 to the buffer unit 45.

The buffer unit 45 separates the inside space of the semiconductor manufacturing apparatus into a first space, which includes the conveyance rail 46, the second arum 47, the ring attaching and detaching units 48a to 48d, and the wet processing units 49a to 49d, and a second space, which includes the interface unit 42, the first arm 43, and the reversing unit 44. The buffer unit 45 is provided, for example, to prevent, for example, the wet processing units 49a to 49d from being contaminated by, for example, dust. It should be noted that the ring attaching and detaching units 48a to 48d are provided in the first space as with the wet processing units 49a to 49d.

The conveyance rail 46 is a rail used to move the second arm 47. The work wafer carried in the buffer unit 45 is transferred by the second arm 47 to any one of the ring attaching and detaching units 48a to 48d. The ring attaching and detaching units 48a to 48d are provided with lift pins P1 to P4, respectively. The protection ring 3 is previously contained in each of the ring attaching and detaching units 48a to 48d.

For example, the work wafer is carried in the ring attaching and detaching unit 48a in such a state that the first wafer 1 is situated on the upper side and the second wafer 2 is situated on the lower side, and is then placed on the lift pin P1. The ring attaching and detaching unit 48a mounts the protection ring 3 around the first wafer 1 of the placed work wafer. On this occasion, the position adjustment between the height of the first wafer 1 and the height of the protection ring 3 is performed with use of the lift pin P1. The above description is also similarly applied to the ring attaching and detaching units 48b to 48d.

The work wafer with the protection ring 3 mounted thereto is transferred from any one of the ring attaching and detaching units 48a to 48d to any one of the wet processing units 49a to 49d. Each of the wet processing units 49a to 49d has the structure illustrated in FIG. 1.

For example, the work wafer with the protection ring 3 mounted thereto is carried from the ring attaching and detaching unit 48a into the wet processing unit 49a in a state in which the first wafer 1 is situated on the upper side and the second wafer 2 is situated on the lower side, and is then held in this state by the vacuum chuck 11 illustrated in FIG. 1. The wet processing unit 49a performs, for example, etching, rinse, cooling, and drying of the work wafer, as described above with reference to FIG. 1.

Then, the work wafer is carried out from the wet processing unit 49a to the ring attaching and detaching unit 48a. The ring attaching and detaching unit 48a detaches the protection ring 3 from around the first wafer 1 of the work wafer. On this occasion, the position adjustment between the height of the first wafer 1 and the height of the protection ring 3 is performed with use of the lift pin P1. Next, the work wafer is carried out from the ring attaching and detaching unit 48a to the reversing unit 44 via the buffer unit 45. The above description is also similarly applied to the ring attaching and detaching units 48b to 48d and the wet processing unit 49b to 49d.

The reversing unit 44 receives the work wafer, which is in a state in which the first wafer 1 is situated on the upper side, from the buffer unit 45, and then reverses the orientation of the work wafer in such a manner that the first wafer 1 is situated on the lower side. The work wafer with the orientation thereof reversed is transferred by the first arm 43 from the reversing unit 44 to any one of the load units 41a to 41d. In this way, processing of the work wafer performed by the semiconductor manufacturing apparatus in the present embodiment is completed.

As described above, the semiconductor manufacturing apparatus according to the present embodiment performs etching of the second wafer 2 with the etching liquid in a state in which the protection ring 3 is mounted around the first wafer 1. Therefore, at least one embodiment enables performing etching of the second wafer 2 while preventing or reducing etching of the first wafer 1. In this way, according to at least one embodiment, etching can be appropriately performed on a part of a work wafer including the first wafer 1 and the second wafer 2 bonded to each other.

Moreover, the semiconductor manufacturing apparatus according to at least one embodiment holds the upper surface of the first wafer 1 with use of the vacuum chuck 11 and ejects the etching liquid onto the lower surface of the second wafer 2. In this case, the etching liquid brought into contact with the second wafer 2 is likely to drop as a result of the force of gravity and is unlikely to move toward the first wafer 1. This facilitates preventing or reducing etching of the first wafer 1 with the etching liquid. However, the orientation of the first wafer 1 or the second wafer 2 is not limited to this, but, for example, an orientation such as that described below in a third embodiment can also be employed.

Furthermore, etching in at least one embodiment may be performed with use of a fluid other than the etching liquid (for example, etching gas). Moreover, the boundary between the first wafer 1 and the second wafer 2 in the present embodiment may be protected from etching with use of a fluid other than the protective liquid (for example, protective gas). Moreover, a part of the work wafer in the present embodiment may be removed by a method other than etching.

Second Embodiment

Figure 5:
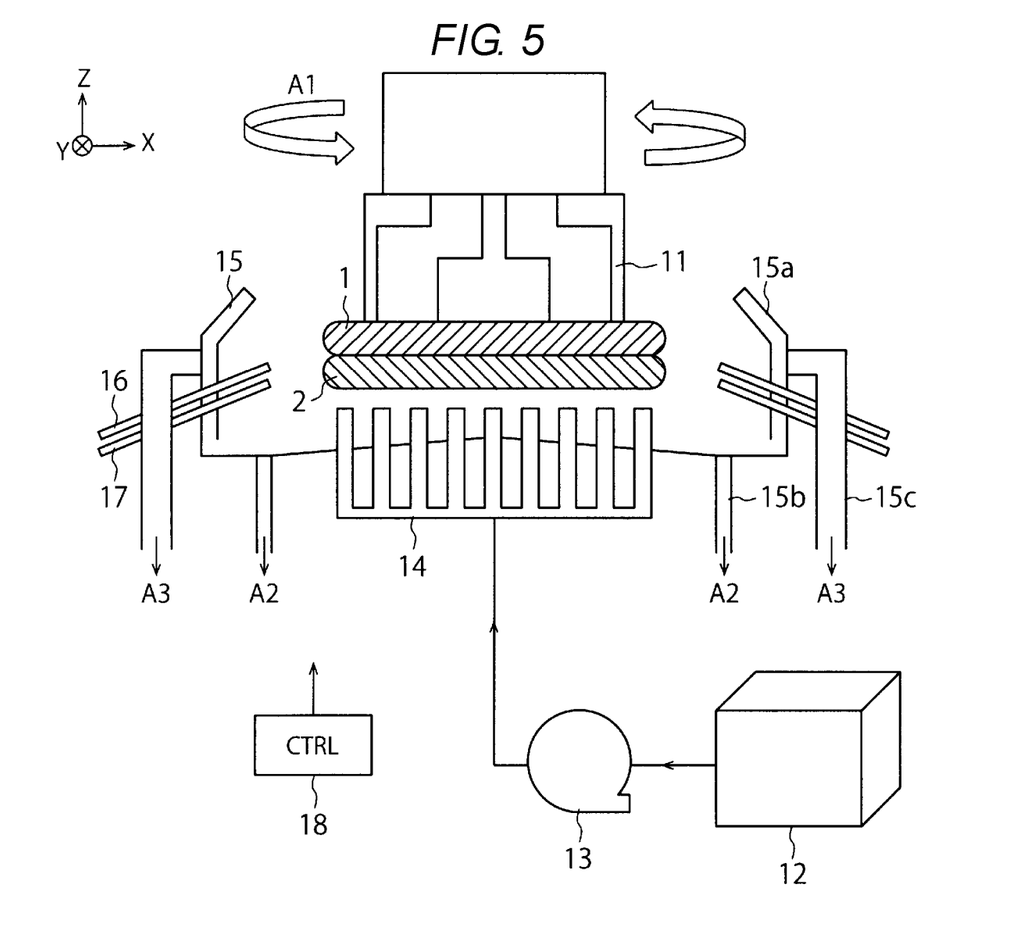
FIG. 5 is a sectional view schematically illustrating a structure of a semiconductor manufacturing apparatus according to a second embodiment.

FIG. 5 is a sectional view schematically illustrating a structure of a semiconductor manufacturing apparatus according to a second embodiment.

The semiconductor manufacturing apparatus according to the present embodiment includes constituent elements similar to those of the semiconductor manufacturing apparatus of the first embodiment as can be seen from the comparison between FIG. 1 and FIG. 5. However, the present embodiment performs etching of a work wafer without mounting the protection ring 3 to the work wafer. It is desirable that such etching be performed, for example, in a case where it is possible to sufficiently protect the work wafer from etching only with a protective liquid supplied from the protective liquid nozzle 16.

According to at least one embodiment, for example, there is no need to arrange the ring attaching and detaching units 48a to 48d in the semiconductor manufacturing apparatus, so that it becomes possible to reduce the size of the semiconductor manufacturing apparatus or reduce the manufacturing cost of the semiconductor manufacturing apparatus.

Conversely, in the first embodiment, in a case where it is possible to sufficiently protect the work wafer from etching only with the protection ring 3, the protective liquid nozzle 16 does not need to be provided in the semiconductor manufacturing apparatus.

Third Embodiment

Figure 6:
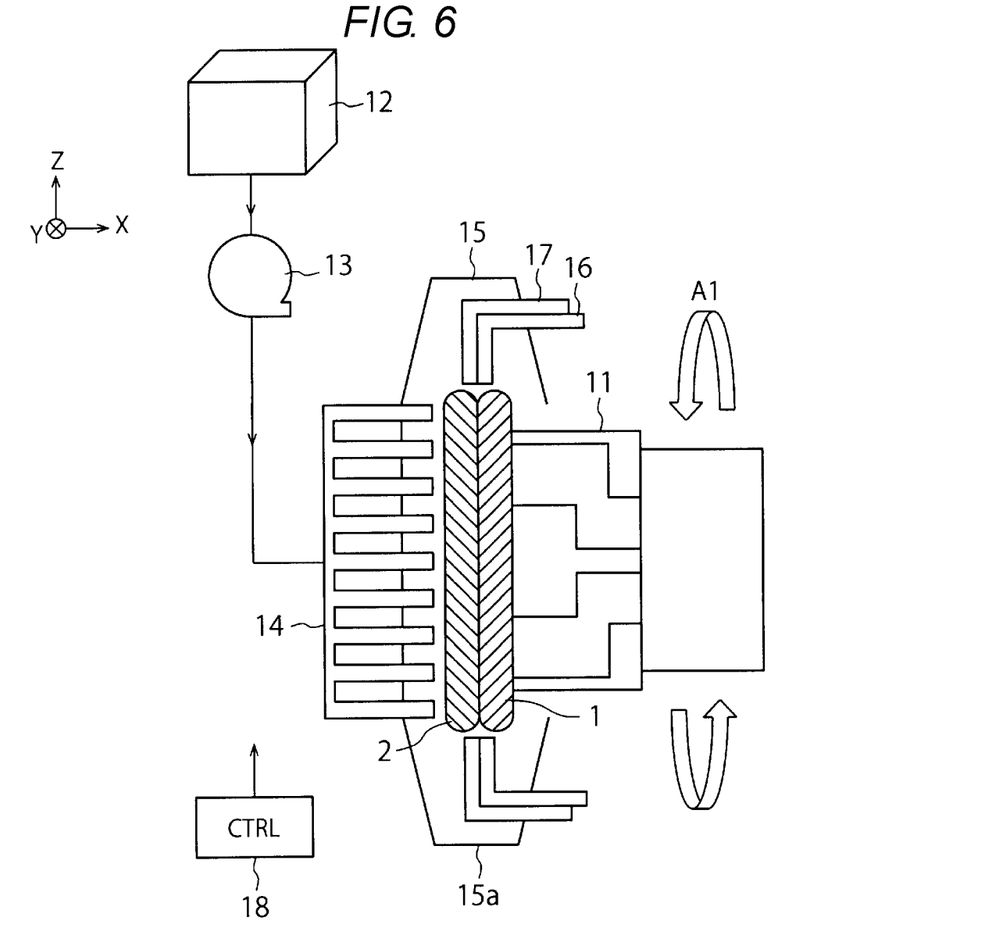
FIG. 6 is a sectional view schematically illustrating a structure of a semiconductor manufacturing apparatus according to a third embodiment.

FIG. 6 is a sectional view schematically illustrating a structure of a semiconductor manufacturing apparatus according to a third embodiment.

The semiconductor manufacturing apparatus according to at least one embodiment includes constituent elements similar to those of the semiconductor manufacturing apparatus of the second embodiment as can be seen from the comparison between FIG. 5 and FIG. 6. However, the orientations of most devices of the present embodiment differ almost 90 degrees from the orientations of corresponding devices of the second embodiment, so that the longitudinal direction and the lateral direction are inverted therebetween. As a result, the vacuum chuck 11 holds the work wafer in such a manner that the first wafer 1 and the second wafer 2 face sideways.

Furthermore, the surfaces of the first wafer 1 and the second wafer 2 in at least one embodiment are parallel to the Z-direction, but may be slanted relative to the Z-direction. In other words, the vacuum chuck 11 may hold the work wafer in such a manner that the first wafer 1 and the second wafer 2 face just sideways or may hold the work wafer in such a manner that the first wafer 1 and the second wafer 2 face obliquely sideways. Moreover, in at least one embodiment, etching of the work wafer may be performed with the protection ring 3 mounted to the work wafer, as in the first embodiment.

Fourth Embodiment

Figure 7A:
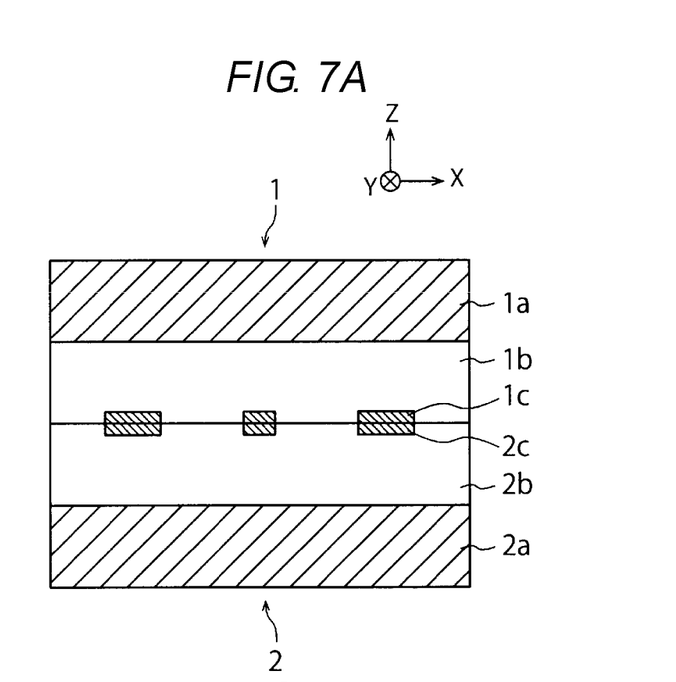
FIGS. 7A and 7B are sectional views schematically illustrating a method for manufacturing a semiconductor device according to a fourth embodiment.
Figure 7B:
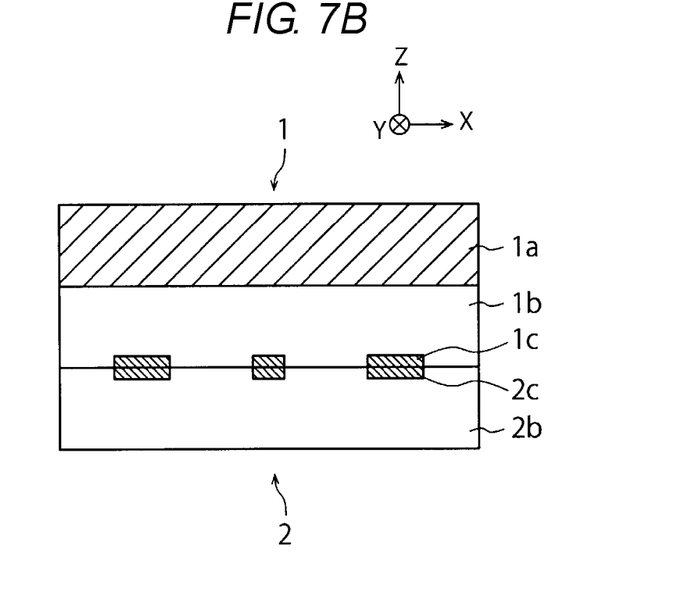

FIGS. 7A and 7B are sectional views schematically illustrating a method for manufacturing a semiconductor device according to a fourth embodiment.

As illustrated in FIG. 7A, the first wafer 1 in the at least one includes a first semiconductor wafer 1a, a first film 1b, and a plurality of first pads 1c, and the second wafer 2 in at least one embodiment includes a second semiconductor wafer 2a, a second film 2b, and a plurality of second pads 2c.

The first semiconductor wafer 1a is, for example, a silicon wafer. The first film 1b is, for example, a stacked film including various interlayer insulating films and interconnection layers. The first pad 1c is, for example, a conductive metal layer, such as a copper (Cu) layer. This also applies to the second semiconductor wafer 2a, the second film 2b, and the plurality of second pads 2c.

The work wafer in at least one embodiment includes a first wafer 1 and a second wafer 2 bonded to each other. The work wafer is produced, for example, in the following way. First, the first wafer 1 and the second wafer 2 are bonded together with mechanical pressure. With this, the insulating film on the surface of the first film 1b and the insulating film on the surface of the second film 2b are bonded to each other. Next, the first wafer 1 and the second wafer 2 are annealed. With this, the first pads 1c and the second pads 2c are joined to each other.

Next, in at least one embodiment, etching of the work wafer is performed with use of the semiconductor manufacturing apparatus of any one of the first to third embodiments, as illustrated in FIG. 7B. FIG. 7B illustrates the work wafer with the semiconductor wafer 2a of the second wafer 2 removed by etching.

The work wafer is then cut into a plurality of chips, thus becoming a plurality of semiconductor devices. In this way, a semiconductor device according to at least one embodiment is manufactured. Furthermore, an example of the first wafer 1 is a circuit wafer including various transistors, and an example of the second wafer 2 is an array wafer including a three-dimensional memory array.

According to at least one embodiment, etching of a work wafer including the first wafer 1 and the second wafer 2 bonded to each other can be appropriately performed to manufacture a semiconductor device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus comprising:
an annular member, the annular member having an annular shape, mounted to a work substrate, the work substrate including a first substrate and a second substrate bonded to each other so that the annular member surrounds a side edge of the first substrate;

a holder arranged to hold the work substrate having the annular member mounted thereto, the holder positioned above the annular member;
a first fluid supply arranged to supply a first fluid to the second substrate of the work substrate held by the holder;
a second fluid supply arranged to supply a second fluid in a second direction towards the annual member; and
an annular member detaching part,
wherein the annular member includes a first section and a second section, each of the first and second sections including a circular arc portion, raised portions at end portions of the circular arc portion, and recessed portions at the end portions of the circular arc portion, the raised portions arranged to be inserted into respective of the recessed portions.

2. The semiconductor manufacturing apparatus according to claim 1, wherein the holder is arranged to hold the work substrate so that the first substrate and the second substrate face sideways.

3. The semiconductor manufacturing apparatus according to claim 1, wherein the holder is arranged to hold the work substrate to be in contact with only the first substrate among the first and second substrates.

4. The semiconductor manufacturing apparatus according to claim 1, wherein the first fluid is an etching liquid used to perform etching of the second substrate.

5. The semiconductor manufacturing apparatus according to claim 1, wherein the first fluid supply includes a plurality of nozzles configured to eject the first fluid onto the second substrate.

6. The semiconductor manufacturing apparatus according to claim 1, wherein the first fluid supply includes a monitor configured to detect a thickness of a semiconductor substrate in the second substrate, supply the first fluid to the semiconductor substrate based on the thickness detected by the monitor, and remove at least a part of the semiconductor substrate with the first fluid.

7. The semiconductor manufacturing apparatus according to claim 1, further comprising a second fluid supply configured to supply a second fluid, which is used to prevent or reduce removal of the first substrate with the first fluid, to a boundary between the first substrate and the second substrate.

8. The semiconductor manufacturing apparatus according to claim 1, further comprising a reverser arranged to receive the work substrate so that the first substrate is situated on a lower side and the second substrate is situated on an upper side, reverse an orientation of the work substrate so that the first substrate is situated on the upper side and the second substrate is situated on the lower side, and provide the work substrate, with the orientation thereof reversed, to the mounting portion.

9. The semiconductor manufacturing apparatus according to claim 1, further comprising a buffer configured to separate an inside space of the semiconductor manufacturing apparatus into a first space, which includes the holder and the first fluid supply, and a second space, in which a doorway for the work substrate into or out of the semiconductor manufacturing apparatus is provided.

10. The semiconductor manufacturing apparatus according to claim 1, wherein the holder includes a vacuum chuck.

11. The semiconductor manufacturing apparatus according to claim 1, further comprising:
a third fluid supply arranged to supply a third fluid in a third direction towards the annual member.

12. A semiconductor manufacturing apparatus comprising:
a load support configured to load a work substrate;
an annular member;
an annular member attaching and detaching part configured to attach and detach the annular member; and
a processing unit configured to process the work substrate,
wherein the processing unit comprising:
a holder arranged to hold the work substrate including a first substrate and a second substrate bonded to each other, the annular member surrounds a side edge of the first substrate;
a first fluid supply arranged to supply a first fluid in a first direction to the second substrate of the work substrate held by the holder; and
a second fluid supply arranged to supply a second fluid in a second direction different from the first direction directly to a boundary between the first substrate and the second substrate,
wherein the annular member attaching and detaching part is located between the load support and the processing unit,
wherein the annular member includes a first section and a second section, each of the first and second sections including a circular arc portion, raised portions at end portions of the circular arc portion, and recessed portions at the end portions of the circular arc portion, the raised portions arranged to be inserted into respective of the recessed portions.

13. A semiconductor manufacturing apparatus according to claim 12, further comprising:
a reverser arranged to receive the work substrate so that the first substrate is situated on a lower side and the second substrate is situated on an upper side, reverse an orientation of the work substrate so that the first substrate is situated on the upper side and the second substrate is situated on the lower side, and provide the work substrate, with the orientation thereof reversed, to the mounting portion
wherein the reverser is located between the load support and the annular member attaching and detaching part.

* * * * *